United States Patent [19]
Liang

[11] Patent Number: 5,875,896
[45] Date of Patent: *Mar. 2, 1999

[54] UNIFIED SEMICONDUCTOR WAFER PACKAGING SYSTEM TO UNIFY IRREGULAR SHAPE BUFFER MATERIALS

[75] Inventor: Wen-Sheng Liang, Hsin chu, Taiwan

[73] Assignee: Taiwan Semiconductor Manufacturing Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 741,750

[22] Filed: Nov. 5, 1996

[51] Int. Cl.⁶ .................................................. B65D 85/30
[52] U.S. Cl. ........................ 206/710; 206/504; 206/593
[58] Field of Search ................................. 206/710, 712, 206/454–456, 504, 509, 511, 521, 523, 585, 588, 591–594, 832; 220/23.4

[56] References Cited

U.S. PATENT DOCUMENTS

| | | |
|---|---|---|
| 3,862,683 | 1/1975 | Koelichen ................................ 206/504 |
| 3,998,379 | 12/1976 | Myers et al. . |
| 4,828,929 | 5/1989 | Pierson . |
| 4,982,858 | 1/1991 | Von Holdt ............................... 206/504 |
| 5,207,327 | 5/1993 | Brondos .................................. 206/592 |
| 5,341,934 | 8/1994 | Hsu ........................................ 206/521 |
| 5,366,080 | 11/1994 | Carstersen et al. .................... 206/523 |
| 5,577,616 | 11/1996 | Liang ..................................... 206/710 |
| 5,706,951 | 1/1998 | Oinuma et al. ........................ 206/710 |

*Primary Examiner*—Paul T. Sewell
*Assistant Examiner*—Luan K. Bui
*Attorney, Agent, or Firm*—George O. Saile; Stephen B. Ackerman; Bill Knowles

[57] ABSTRACT

A semiconductor wafer packaging system to cushion semiconductor wafers from damage from shock and vibration during transportation is described. The semiconductor wafer packaging system has at least one a wafer case to enclose the semiconductor wafers. Each wafer case is placed within a wafer case padding unit. Each padding unit includes a rectangular cushioning block and a plurality of trapezoidal spacer blocks affixed to the four sides of the rectangular cushioning block. The rectangular cushioning block has an opening to accept the wafer case and a plurality of trapezoidal notches on two adjoining sides of the rectangular cushioning block. The wafer case padding unit is placed within a packaging canister for transportation.

18 Claims, 6 Drawing Sheets

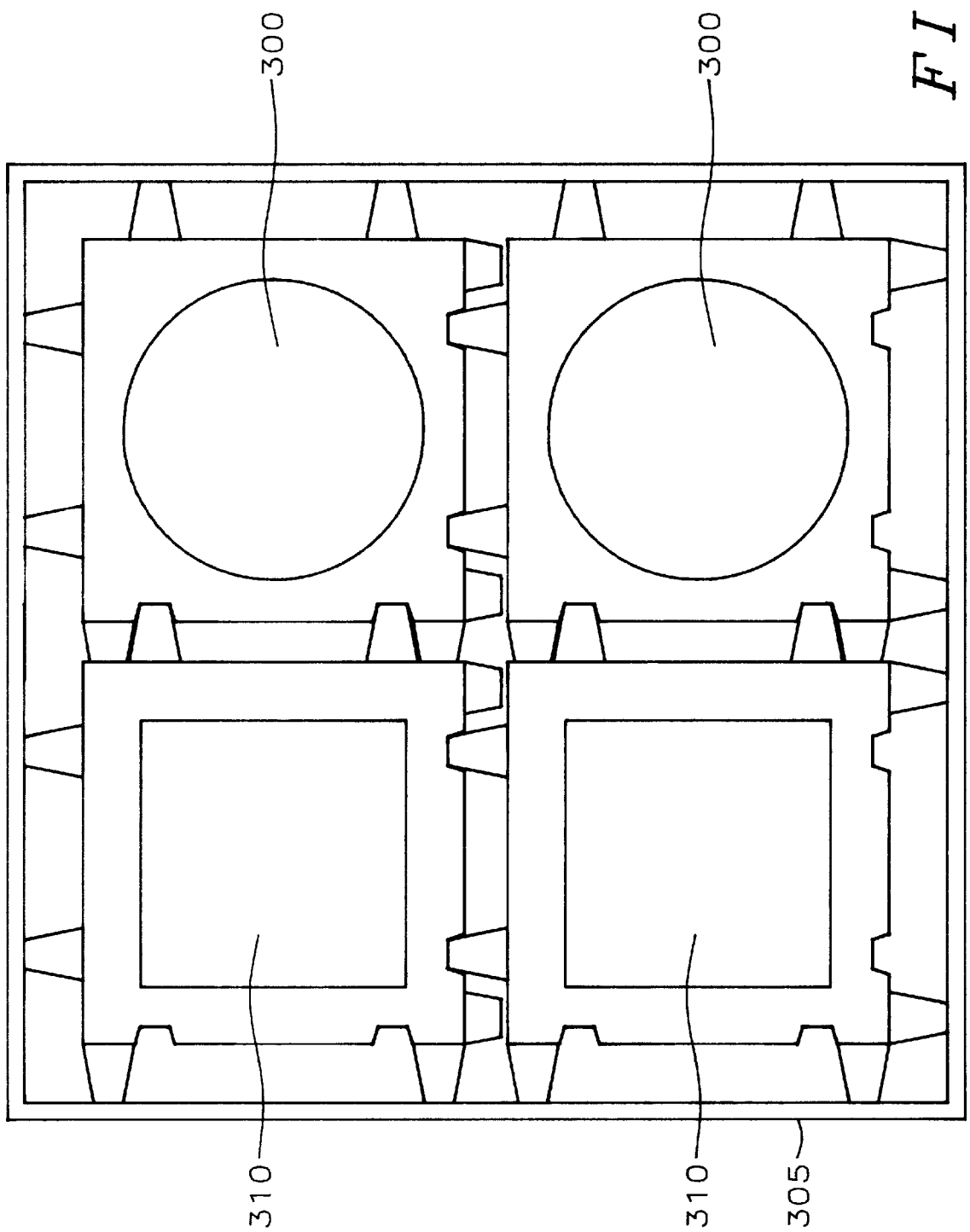

UNIFIED SEMICONDUCTOR WAFER PACKAGING SYSTEM TO UNIFY IRREGULAR SHAPE BUFFER MATERIALS

BACKGROUND OF THE INVENTION

1. Field of the Invention

This invention relates to the systems for packaging of semiconductor wafers to prevent damage and breakage during transportation and more particularly to padding structures to buffer shock and vibration encountered during transportation of the semiconductor wafers.

2. Description of Related Art

Various containers, boxes, and filler shapes are well known and used in many industries. U.S. Pat. Nos. 3,998,379 (Myers) and 4,828,929 (Pierson) are examples of boxes to carry such objects as coin rolls and cylindrical objects such as so called wheels of cheese.

The shipment of semiconductor wafers requires that the semiconductor wafers be buffered from shock and vibration. The semiconductor wafer cases are either circular or rectangular in shape.

If semiconductor wafers are to be shipped in a mixture of circular and rectangular semiconductor wafer cases, the cases must be packaged and padded in separate shipping containers to accommodate the difference in shapes of the semiconductor wafer cases. This increases the costs of shipping and of shipping materials.

SUMMARY OF THE INVENTION

An object of this invention is to provide a semiconductor wafer packaging system that will prevent damage to semiconductor wafers due to shock and vibration encountered during transportation. A further object of this is to provide a semiconductor wafer packaging system that will decrease the cost of shipping and shipping materials.

To accomplish these and other objects, the semiconductor wafer packaging system has a wafer case to enclose and support semiconductor wafers. The semiconductor wafer packaging system also has at least one wafer case padding units to absorb shock and vibration during transportation and a packaging canister to accept the wafer case padding units. The wafer case padding unit includes a rectangular cushioning block having an opening to accept either the rectangular, or circular, or both rectangular and circular wafer cases. The rectangular cushioning block has trapezoidal notches on two adjoining sides. Attached to the rectangular cushioning block are multiple trapezoidal spacer blocks. The trapezoidal spacer blocks attached on the sides of the trapezoidal notches are placed adjacent to the trapezoidal notches. The trapezoidal spacer blocks attached on the sides opposite the trapezoidal notches are aligned with the notches.

BRIEF DESCRIPTION OF THE DRAWINGS

FIG. 5 illustrates a top view of a packaging canister containing four wafer case padding units of this invention.

DETAILED DESCRIPTION OF THE INVENTION

Figure 1:
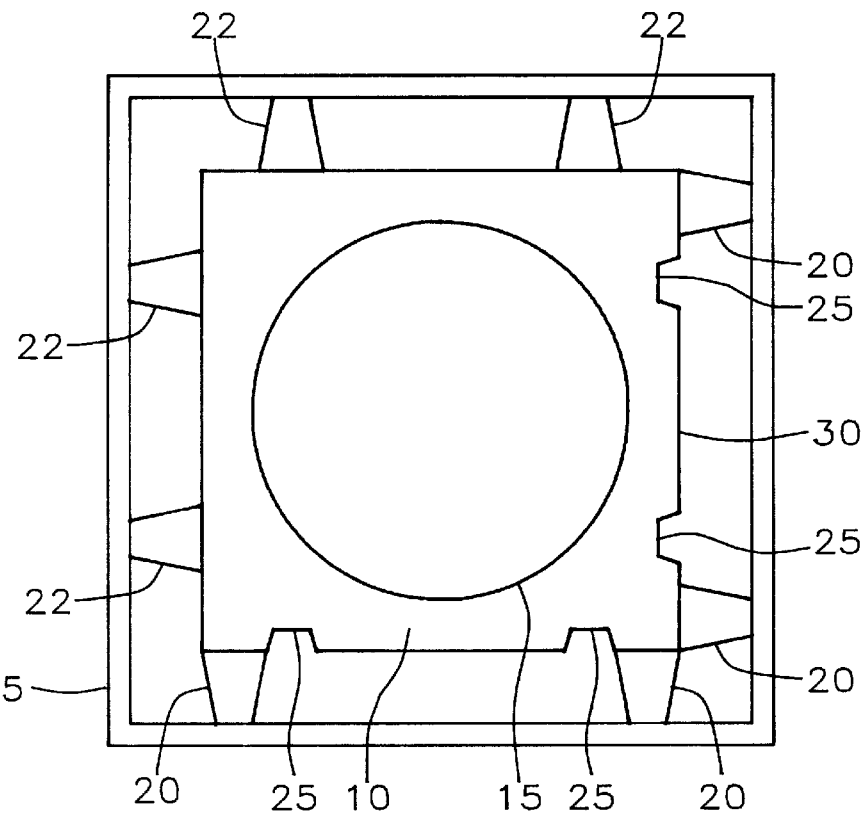
FIG. 1 illustrates a top view of a packaging canister containing a wafer case padding unit for circular semiconductor wafer cases of this invention.

FIG. 1 illustrates a top view of a wafer case padding unit 30 placed within a packaging canister 5. A circular semiconductor wafer case 15 is placed within an opening placed in the rectangular cushioning block 10. The rectangular cushioning block 10 has trapezoidal notches 25 placed on two adjoining sides equidistant from the corners of the rectangular cushioning block 10.

Attached to the rectangular cushioning block are trapezoidal spacer blocks 20. The trapezoidal spacer blocks 20 that are placed on the sides of the rectangular cushioning block 10 that contain the trapezoidal notches 25, are placed between the trapezoidal notches 25 and the corners of the rectangular cushioning block 10. The trapezoidal spacer blocks 20 placed on the side of the rectangular cushioning block 10 on the sides opposite the trapezoidal notches 25, are aligned with the trapezoidal notches 25.

The materials for the wafer case padding unit 30 may be vegetable fibrous materials such as cellulose, paper, and corrugated fiber board, or the materials may be of such synthetic materials such as foamed polystyrene or foamed polyurethane. Any of the above materials may be from post consumer recycled sources. The materials that compose the wafer case padding unit 30 must have sufficient resistance to shock and vibration to prevent damage to the wafer case 15 and the semiconductor wafer during transportation.

The wafer case padding unit 30 slides into the packaging canister 5 and is sealed for transportation. The packaging canister will commonly be a corrugated fiberboard carton.

The dimensions of the packaging canister 5 and the wafer case packaging unit 30 must be sufficiently large as to accommodate wafers of up to 200 mm in the present technology.

Figure 2:
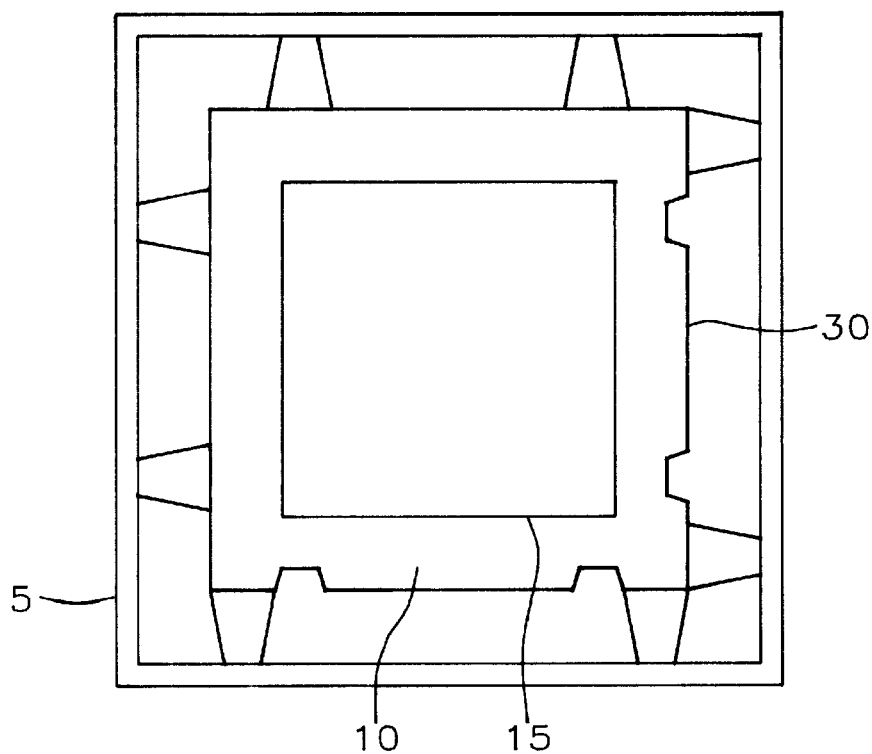
FIG. 2 illustrates a top view of a packaging canister containing a wafer case padding unit for rectangular semiconductor wafer cases of this invention.

FIG. 2 shows a top view of a wafer case padding unit 30 placed within a packaging canister 5. The wafer case padding unit 30 has a rectangular semiconductor wafer case 15 placed within the rectangular cushioning block 10. The structure of the wafer case padding unit 30 is identical to that shown in FIG. 1, except for the opening for the rectangular wafer case 15.

Figure 3:
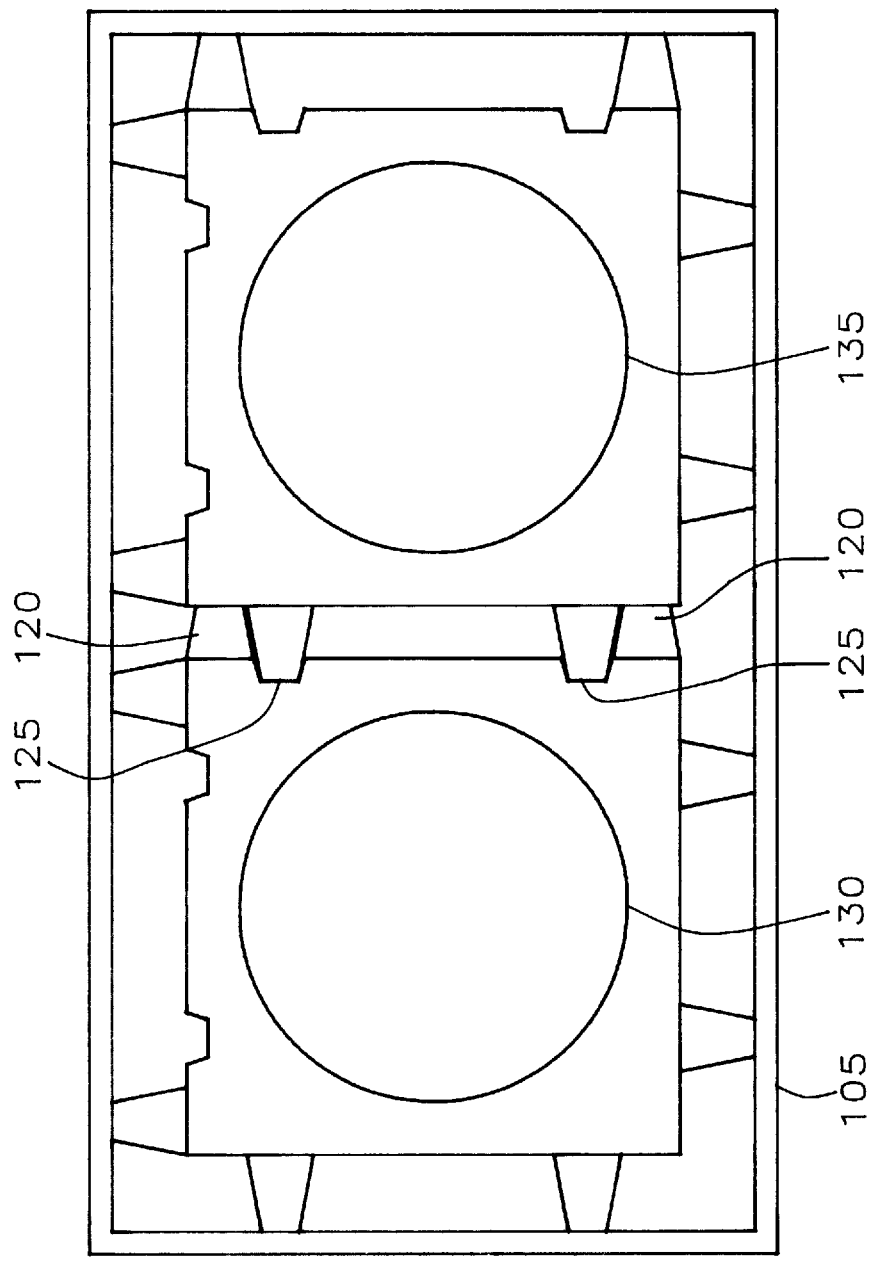
FIG. 3 illustrates a top view of a packaging canister containing two wafer case padding units for circular semiconductor wafer cases of this invention.
Figure 4:
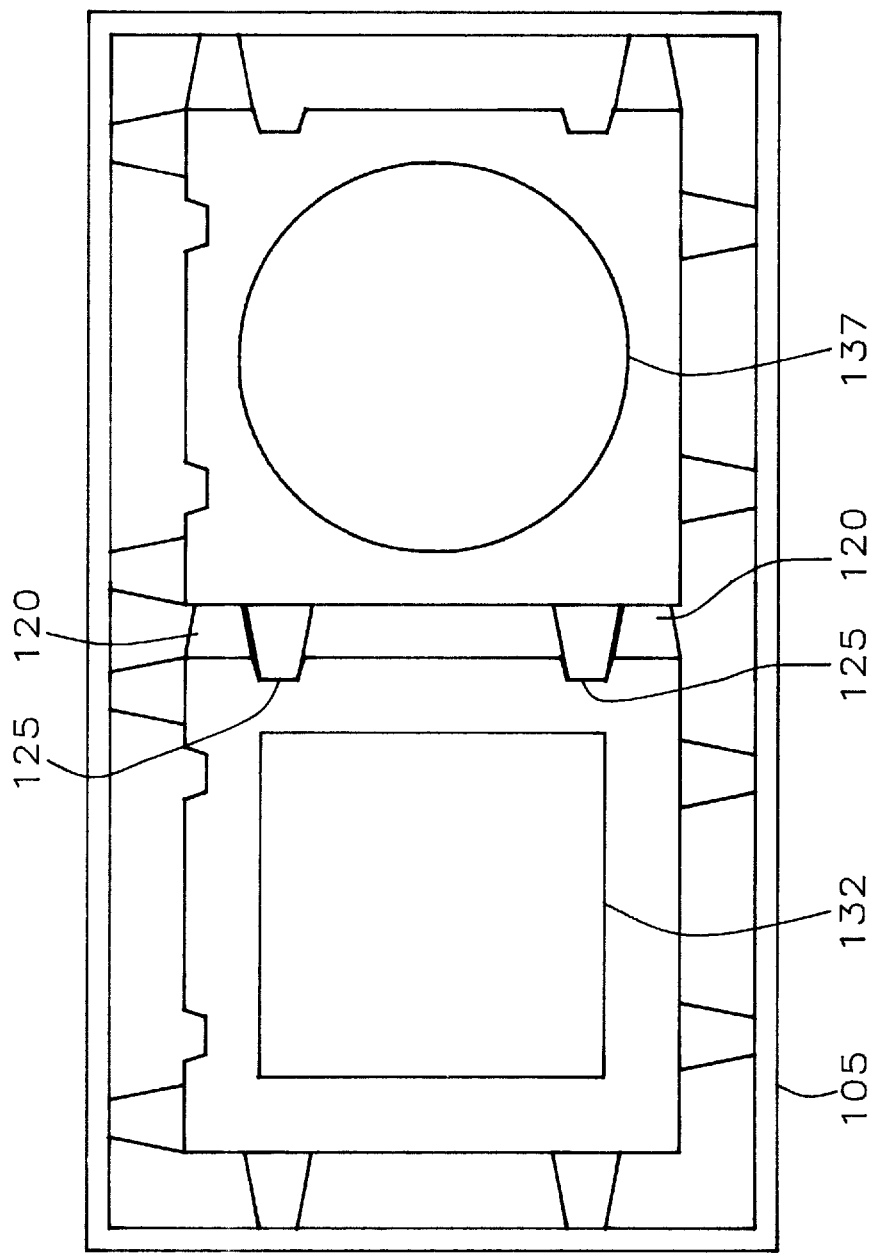
FIG. 4 illustrates a top view of a packaging canister containing two wafer case padding units for circular and rectangular semiconductor wafer cases of this invention.

FIGS. 3 and 4 demonstrate a packaging canister 105 containing two wafer case padding units 130 and 135,132 and 137. In FIG. 3 the wafer case padding units 130 and 135 accept circular wafer cases and in FIG. 4 the wafer case padding units 132 and 137 will accept both rectangular and circular wafer cases.

Continuing to refer to FIGS. 3 and 4, the trapezoidal spacer blocks 120 are compressed against wafer case padding unit 135 or 137. The trapezoidal spacer blocks 125 are aligned to fit in the trapezoidal notches of the wafer case padding unit 130 and 132. This prevents motion of the wafer case padding units 130 and 135, 132 and 137 during shock and vibration of transportation.

FIG. 5 illustrates a packaging canister 305 containing four wafer case padding units. In this example two of the semiconductor wafer cases are rectangular 310 and two of the semiconductor wafer case are circular 300.

Any mixture of circular and rectangular wafer case padding units may be placed within the packaging canister to facilitate the transportation of semiconductor wafers. The wafer case padding unit may various sized openings to accept variations in the size of the wafer cases for a mixture in the sizes of semiconductor wafers to be transported.

Figure 6A:
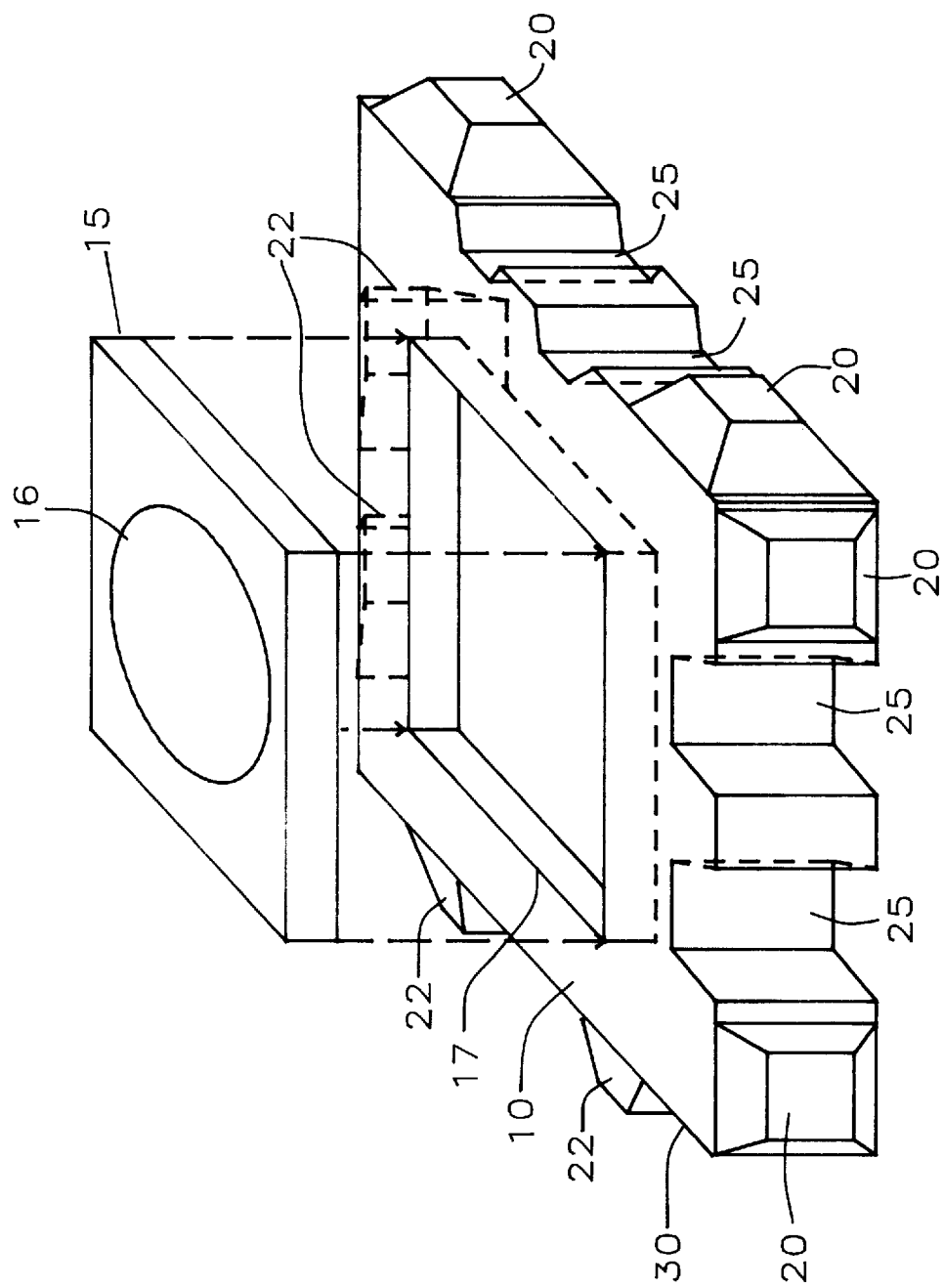
FIGS. 6a and 6b show three dimensional views of a wafer case padding unit as viewed from the top and the bottom showing the placement of a wafer case within the unit.
Figure 6B:
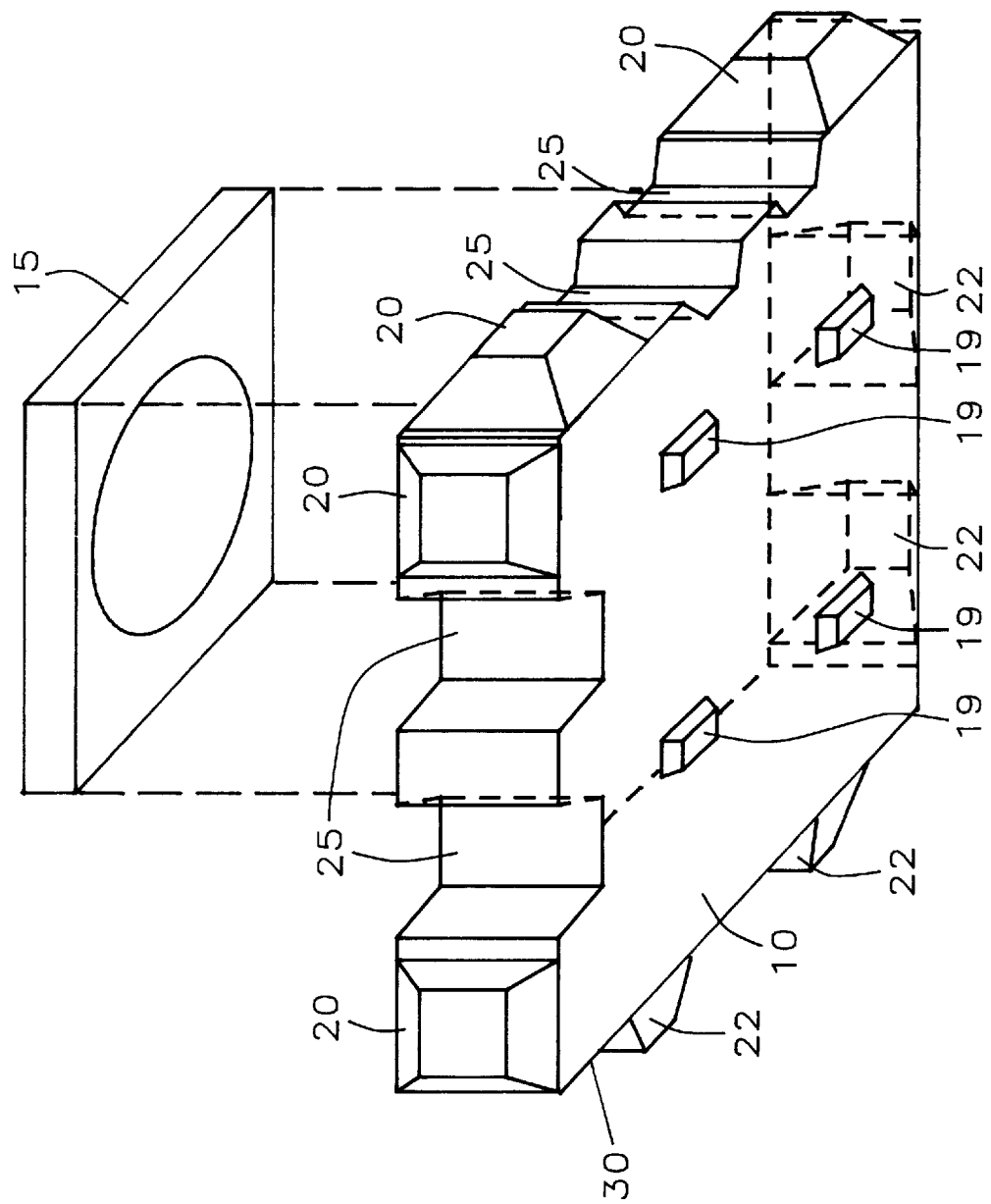

FIGS. 6a and 6b illustrates a wafer case 15 containing a semiconductor wafer 16, being placed within a wafer case padding unit 30. The wafer case 15 will fit into the opening 17 so as to provide a cushioning fit for the wafer case 15. Trapezoidal spacer blocks 20 and 22 are attached to the rectangular cushioning block 10 and the trapezoidal notches are let into the rectangular cushioning block 10 as described above.

The bottom spacer blocks 19 are attached to the rectangular cushioning block 10 to provide a cushioning when multiple wafer case padding units are to be stacked within a packaging canister 5 of FIG. 1.

While this invention has been particularly shown and described with reference to the preferred embodiments thereof, it will be understood by those skilled in the art that various changes in form and details may be made without departing from the spirit and scope of the invention.

What is claimed is:

1. A semiconductor wafer packaging system to cushion at least one semiconductor wafer from damage from shock and vibration during transportation, comprising:
    a) at least one wafer case enclosing said semiconductor wafer;
    b) at least one wafer case padding unit, wherein each padding unit includes:
        a rectangular cushioning block having an opening on a top side to accept said wafer case and a plurality of trapezoidal notches on two adjoining sides of said cushioning block, and
        a plurality of trapezoidal spacer blocks affixed to four sides and a bottom side of said rectangular cushioning block; and
    c) a packaging canister to accept at least one wafer case padding unit.

2. The packaging system of claim 1 wherein the wafer case will have a size and geometry necessary to accommodate said semiconductor wafer and wherein said geometry is selected from a group of geometric shapes consisting of rectangular shapes and circular shapes.

3. The packaging system of claim 1 wherein the wafer case padding unit is of a recyclable material that is a vegetable fibrous material which is selected from a group of vegetable fibrous materials consisting of paper, cellulose, and corrugated fiber board.

4. The packaging system of claim 1 wherein the trapezoidal spacer blocks are comprised of a recyclable material that is a vegetable fibrous material which is selected from a group of vegetable fibrous materials consisting of paper, cellulose, and corrugated fiber board.

5. The packaging system of claim 1 wherein the packaging canister has a size so as to accept the wafer case padding units of various sizes and geometries to minimize damage from shock and vibration to said semiconductor wafers during transportation.

6. The packaging system of claim 1 wherein the trapezoidal spacer blocks on the adjoining sides of the rectangular cushioning blocks containing the trapezoidal notches are placed adjacent to said trapezoidal notches and the spacer blocks on the adjoining sides opposite the trapezoidal notches are placed in alignment with said trapezoidal notches, so that as a first wafer case padding unit and a second wafer case padding unit are placed adjacent in said packaging canister, the trapezoidal spacer blocks on the adjoining sides opposite the notches of the first wafer case padding unit are seated in the notches of the second wafer case padding unit to cushion said semiconductor wafers from shock and vibration.

7. The packaging system of claim 6 wherein said notches allow placement of wafer cases having differing sizes and geometries within a single packaging canister.

8. The packaging system of claim 1 wherein the wafer case padding unit is of a recyclable material that is a synthetic material that is selected from a group of synthetic materials consisting of foamed polystyrene and foamed polyurethane.

9. The packaging system of claim 1 wherein the trapezoidal spacer blocks are comprised of a recyclable material that is selected from a group of synthetic materials consisting of foamed polystyrene and foamed polyurethane.

10. A padding unit for cushioning a semiconductor wafer case to be contained therein, comprising:
    a) a rectangular cushioning block having an opening in a top side to accept said semiconductor wafer case and a plurality of trapezoidal notches on two adjoining sides of said cushioning block; and
    b) a plurality of trapezoidal spacer blocks affixed to four sides and a bottom side of said rectangular cushioning block;
    wherein the trapezoidal spacer blocks on the adjoining sides of the rectangular cushioning blocks containing the trapezoidal notches are placed adjacent to said trapezoidal notches and the spacer blocks on the adjoining sides opposite the trapezoidal notches are placed in alignment with said trapezoidal notches, so that as a first wafer case padding unit and second wafer case padding unit are placed adjacent in a packaging canister, the trapezoidal spacer blocks on the adjoining sides opposite the notches of the first wafer case padding unit are seated in the notches of the second wafer case padding unit to cushion said semiconductor wafers from shock and vibration.

11. The padding unit of claim 10 wherein at least one padding unit is placed in the packaging canister to protect said semiconductor wafer from shock and vibration during transportation.

12. The padding unit of claim 10 wherein said opening will have a size and geometry necessary to accommodate a semiconductor wafer case containing a semiconductor wafer and wherein said geometry is selected from a group of geometric shapes consisting of rectangular shapes and circular shapes.

13. The padding unit of claim 10 wherein the wafer case padding unit is of a recyclable material that is a vegetable fibrous material which is selected from a group of vegetable fibrous materials consisting of paper, cellulose, corrugated fiber board.

14. The padding unit of claim 10 wherein the trapezoidal spacer blocks are comprised of a recyclable material that is a vegetable fibrous material which is selected from a group of vegetable fibrous materials consisting of paper, cellulose, and corrugated fiber board.

15. The padding unit of claim 12 wherein the packaging canister has a size so as to accept a plurality of the padding units to minimize damage from shock and vibration to said semiconductor wafers during transportation.

16. The wafer case padding unit of claim 12 wherein said notches allow placement of having openings of differing sizes and geometries within a single packaging canister.

17. The padding unit of claim 10 wherein the wafer case padding unit is of a recyclable material that is a synthetic material that is selected from a group of synthetic materials consisting of foamed polystyrene and foamed polyurethane.

18. The packaging system of claim 10 wherein the trapezoidal spacer blocks are comprised of a recyclable material that is selected from a group of synthetic materials consisting of foamed polystyrene and foamed polyurethane.

* * * * *